US007772065B2

(12) United States Patent
Ohuchi

(10) Patent No.: US 7,772,065 B2
(45) Date of Patent: Aug. 10, 2010

(54) SEMICONDUCTOR MEMORY DEVICE INCLUDING A CONTACT WITH DIFFERENT UPPER AND BOTTOM SURFACE DIAMETERS AND MANUFACTURING METHOD THEREOF

(75) Inventor: Masahiko Ohuchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 121 days.

(21) Appl. No.: 12/024,068

(22) Filed: Jan. 31, 2008

(65) Prior Publication Data
US 2008/0185683 A1 Aug. 7, 2008

(30) Foreign Application Priority Data
Feb. 1, 2007 (JP) ............... 2007-022842

(51) Int. Cl.
*H01L 21/8242* (2006.01)
(52) U.S. Cl. .............. 438/256; 438/253; 438/399; 438/618; 438/620; 438/666; 257/68; 257/71; 257/E27.084; 257/E21.646; 257/906; 257/908
(58) Field of Classification Search ......... 257/758, 257/E27.084; 438/118, 622, 666, 256, 253, 438/399
See application file for complete search history.

(56) References Cited

U.S. PATENT DOCUMENTS

| | | | | |
|---|---|---|---|---|
| 6,417,534 B2 * | 7/2002 | Nakahata et al. | ............ | 257/306 |
| 6,696,337 B2 * | 2/2004 | Asano et al. | ............ | 438/253 |
| 2001/0030372 A1 * | 10/2001 | Mori et al. | ............ | 257/903 |
| 2002/0096726 A1 * | 7/2002 | Koike | ............ | 257/384 |

FOREIGN PATENT DOCUMENTS

| | | |
|---|---|---|
| JP | 2000-77620 A | 3/2000 |
| JP | 2003-264196 A | 9/2003 |
| JP | 2006-120832 A | 5/2006 |

* cited by examiner

*Primary Examiner*—Marcos D. Pizarro
*Assistant Examiner*—Eva Yan Mantalvo
(74) *Attorney, Agent, or Firm*—Sughrue Mion, PLLC

(57) ABSTRACT

A semiconductor memory device includes diffusion regions formed in an active region; cell contacts connected to the diffusion regions, respectively; pillars connected to the cell contacts, respectively; a bit line connected to the pillar; capacitor contacts connected to the pillars, respectively; and storage capacitors connected to the capacitor contacts, respectively. Accordingly, the pillars exist between the cell contacts and the capacitor contacts, and thus, depths of the capacitor contacts are made correspondingly shorter. Therefore, it becomes possible to prevent occurrence of shorting defects while decreasing resistance values of the capacitor contacts.

13 Claims, 14 Drawing Sheets

SEMICONDUCTOR MEMORY DEVICE INCLUDING A CONTACT WITH DIFFERENT UPPER AND BOTTOM SURFACE DIAMETERS AND MANUFACTURING METHOD THEREOF

TECHNICAL FIELD

The present invention relates to a semiconductor memory device and a manufacturing method thereof, and, more particularly relates to a memory cell of a DRAM (Dynamic Random Access Memory) and a manufacturing method thereof.

BACKGROUND OF THE INVENTION

In the DRAM, which is one of semiconductor memory devices, a memory cell is configured by one cell transistor and one storage capacitor, and thus, a higher storage capacity can be obtained as compared to other semiconductor memory devices. However, when the memory cell of the DRAM is miniaturized, an area on a semiconductor substrate which can be allocated to the storage capacitor becomes small. Thus, to secure a sufficient capacity value, it is required that the storage capacitor have a three-dimensional structure. As a storage capacitor having a three-dimensional structure, a stacked capacitor is well known (see Japanese Patent Applications Laid-open Nos. 2006-120832, 2000-77620, and 2003-264196).

FIG. 14 is a schematic cross-sectional view showing a conventional memory-cell structure having a stacked capacitor.

As shown in FIG. 14, the conventional DRAM is formed with two memory cells in one active region 11 divided by element isolation regions 12. That is, three diffusion regions 21 to 23 are formed in the active region 11. Above the diffusion regions 21 and 22 are adjacent to each other, and above the diffusion regions 21 and 23 are adjacent to each other. The gate electrodes 14 are formed via gate isolating films 13 on the semiconductor substrate. The gate electrodes 14 are word lines of the memory cell.

The three diffusion regions 21 to 23 are connected to cell contacts 31 to 33, respectively. Out of the cell contacts 31 to 33, the cell contact 31 connected to the center diffusion region 21 is connected to a bit line 15 via a bit contact 41 which passes through an interlayer insulating film 61. On the other hand, out of the cell contacts 31 to 33, the cell contacts 32 and 33 connected to the diffusion regions 22 and 23 respectively on both ends are connected to a storage capacitor 70 via capacitor contacts 52 and 53 which pass through the interlayer insulating film 61 and an interlayer insulating film 62.

The storage capacitor 70 is buried in a thick interlayer insulating film 63 and configured by a lower electrode 71, an upper electrode 72, and a capacitive insulating film 73. The lower electrode 71 is made of polycrystalline silicon and connected to the capacitor contacts 52 or 53. A plate potential is applied to the upper electrode 72. The capacitive insulating film 73 is placed between the lower electrode 71 and the upper electrode 72. The upper electrode 72 is covered by an interlayer insulating film 64.

When the memory cell having such structure is miniaturized, a distance D between the bit contact 41 and the capacitor contact 52 or 53 made of polycrystalline silicon becomes narrow, and thus, a processing margin decreases. Thus, the bit contact 41 and the capacitor contact 52 or 53 are short-circuited more easily.

To avoid shorting defects, it is necessary to reduce diameters of the capacitor contacts 52 and 53 located at the same height as that of the top surface of the bit contact 41. To satisfy this need, it is necessary to form a capacitor contact hole in a slanted manner such that the lower diameter is smaller than a diameter of an aperture. To form a slanted capacitor contact hole, a sufficient thickness of the interlayer insulating film 62 is necessary, for example, about 500 nm is necessary. As described above, to avoid shorting between the bit contact 41 and the capacitor contact 52 or 53, there is no other choice but to reduce the diameter (bottom diameter) at the bottom of the capacitor contact 52 or 53. As a result, a resistance value of the capacitor contacts 52 and 53 are increased.

Thus, the resistance value of the capacitor contact and a reliability thereof are in a trade-off relationship. Accordingly, it is conventionally difficult to prevent occurrence of shorting defects while decreasing the resistance value of the capacitive value.

SUMMARY OF THE INVENTION

It is therefore an object of the present invention to provide a semiconductor memory device can prevent occurrence of shorting defects while decreasing a resistance value of a capacitor contact, and a manufacturing method thereof.

The above and other objects of the present invention can be accomplished by a semiconductor memory device, comprising: a first word line; first and second diffusion regions electrically connected upon activation of the first word line; first and second cell contacts connected to the first and second diffusion regions, respectively; first and second pillars connected to the first and second cell contacts, respectively; a bit line connected to the first pillar; a first capacitor contact connected to the second pillar; and a first storage capacitor connected to the first capacitor contact, wherein the first and second pillars are formed in the same wiring layer.

The above and other objects of the present invention can also be accomplished by a method of manufacturing a semiconductor memory device, comprising: a first step for forming a transistor including first and second diffusion regions; a second step for simultaneously forming first and second cell contacts connected to the first and second diffusion regions, respectively; a third step for simultaneously forming first and second pillars connected to the first and second cell contacts, respectively; a fourth step for forming a bit line connected to the first pillar; a fifth step for forming a capacitor contact connected to the second pillar; and a sixth step for forming a storage capacitor connected to the capacitor contact.

According to the present invention, pillars exist between the cell contacts and the capacitor contacts, and therefore, depths of the capacitor contacts can be made correspondingly shorter. Thereby, the bottom diameters of the capacitor contacts can be enlarged as compared to those in the conventional case, and the capacitor contacts can be formed precisely. Accordingly, it becomes possible to prevent occurrence of shorting defects while decreasing the resistance value of the capacitor contact.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
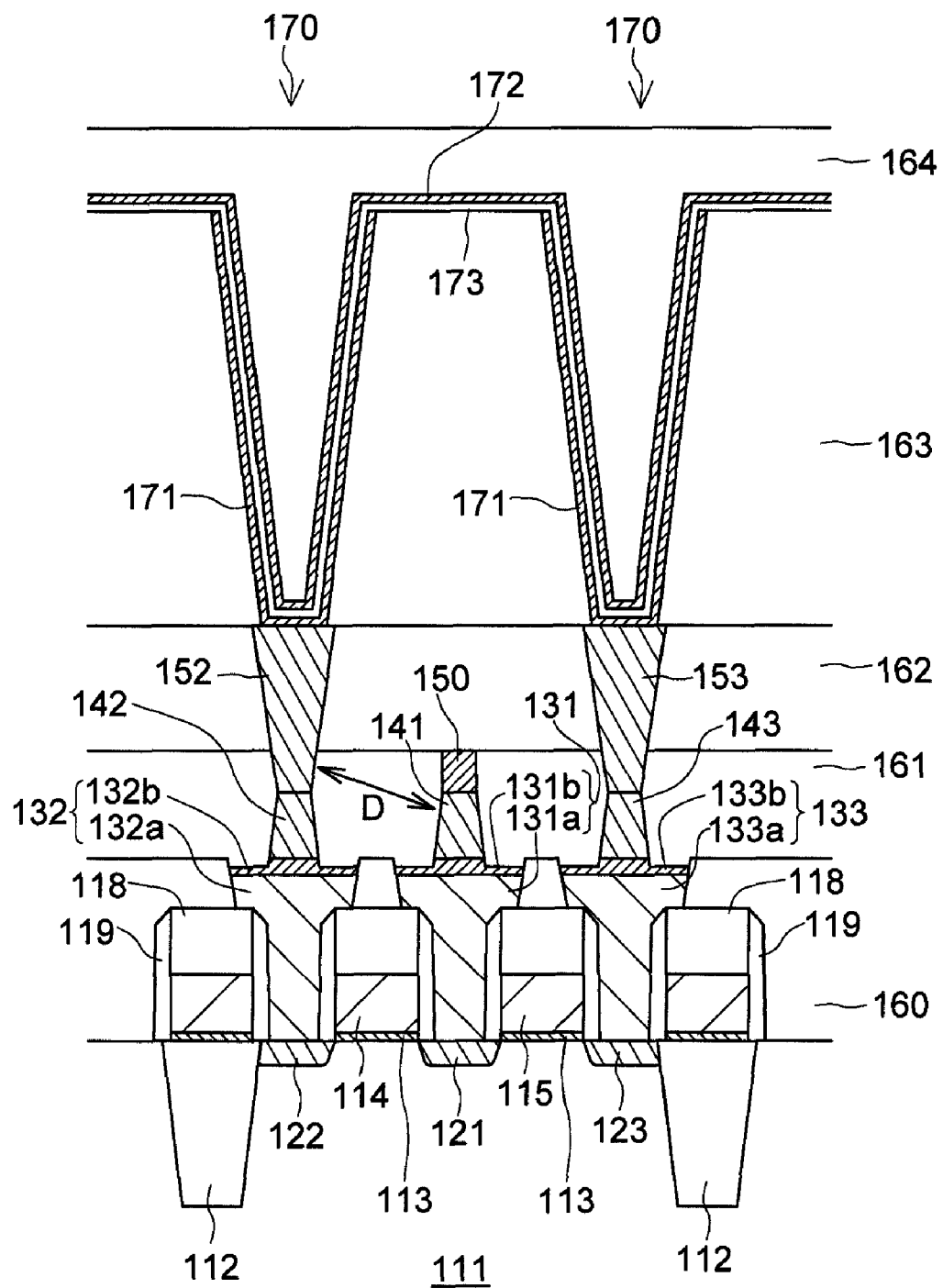
FIG. 1 is a schematic cross-sectional view showing a structure of a semiconductor memory device according to a preferred embodiment of the present invention.

FIG. 1 is a schematic cross-sectional view showing a structure of a semiconductor memory device according to a preferred embodiment of the present invention. The semiconductor memory device according to the embodiment is a DRAM. One active region 111 divided by element isolation regions 112 is formed with two memory cells.

As shown in FIG. 1, one active region 111 divided by the element isolation regions 112 is formed with three diffusion regions 121 to 123. Above the diffusion regions 121 and 122 are adjacent to each other. A gate electrode 114 is formed via a gate insulating film 113 on the active region 111, whereby one cell transistor is configured. Accordingly, upon activation of the gate electrode 114, the diffusion regions 121 and 122 adjacent to each other are electrically connected.

Similarly, above the diffusion regions 121 and 123 are adjacent to each other. A gate electrode 115 is formed via the gate insulating film 113 on the active region 111, whereby another cell transistor is configured. Accordingly, upon activation of the gate electrode 115, the diffusion regions 121 and 123 adjacent to each other are electrically connected. The gate electrodes 114 and 115 are word lines of the memory cell.

The three diffusion regions 121 to 123 are connected to cell contacts 131 to 133, respectively. The cell contacts 131 to 133 have a two-layered structure including lower regions 131a to 133a and upper regions 131b to 133b, respectively. The lower regions 131a to 133a are made of doped polycrystalline silicon, and contact the diffusion regions 121 to 123, respectively. The upper regions 131b to 133b are made of a metal material, and contact pillars described later.

In the present embodiment, interfaces between the lower regions 131a to 133a and the upper regions 131b to 133b are located at positions where diameters of the cell contacts are enlarged. That is, the cell contacts 131 to 133 have such shapes that diameters at interfaces with the diffusion regions 121 to 123 are small and diameters at upper portions are enlarged. The interfaces are positioned in regions where the diameters are thus enlarged. The reason for this is that when an area in which the doped polycrystalline silicon and the metal material are in contact is sufficiently secured, an interface resistance can be reduced.

Figure 14:
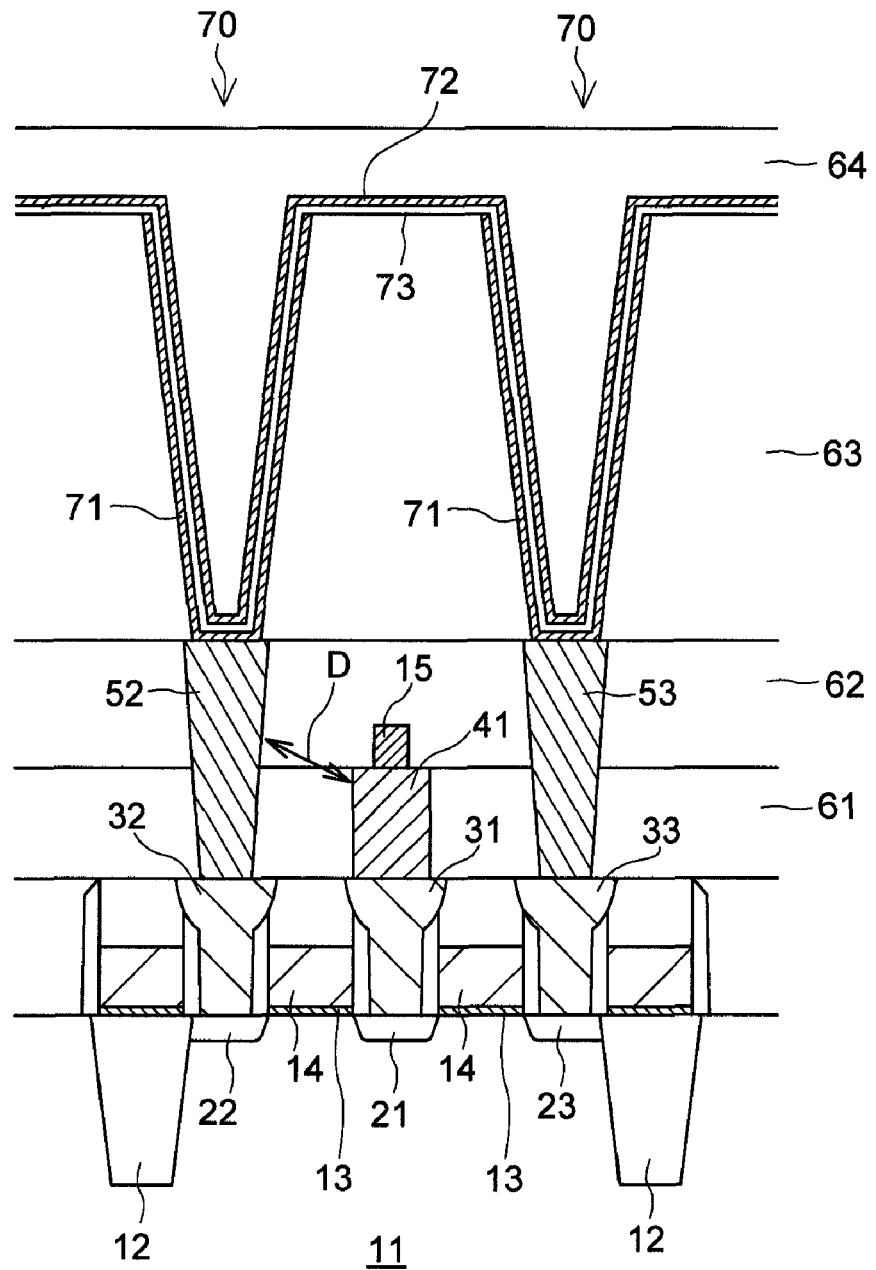
FIG. 14 is a schematic cross sectional view showing a conventional memory-cell structure having a stacked capacitor.

In the conventional semiconductor memory device shown in FIG. 14, an interface between the cell contact 31 and the bit contact 41 corresponds to that between the doped polycrystalline silicon and the metal material. Thus, an area of the interface is limited by the bottom area of the bit contact 41, and thus, a sufficient area cannot be retained. Further, when misalignment occurs, the area on which the cell contact 31 and the bit contact 41 are superposed is further reduced. As opposed thereto, in the present embodiment, the interfaces mentioned above are formed inside the cell contacts 131 to 133, and thus, a sufficient contact area can be retained irrespective of alignment.

As shown in FIG. 1, the cell contacts 131 to 133 are connected to pillars 141 to 143 formed in an upper layer, respectively. The pillars 141 to 143 are made of a metal material, and each buried inside an interlayer insulating film 161. That is, the pillars 141 to 143 are formed in the same wiring layer.

The pillars 141 to 143 each have a trapezoidal shape such that a diameter of the upper surface portion is smaller than that of the bottom surface portion. The reason for that is to retain a distance D between the pillar and a capacitor contact, described later, at the upper surface portions while sufficiently retaining contact areas with the cell contacts 131 to 133 at the bottom surface portions.

Out of the pillars 141 to 143, the center pillar 141 corresponds to a so-called bit contact. Accordingly, the center pillar 141 is connected to a bit line 150 formed in the upper layer. On the other hand, the pillars 142 and 143 located on both ends are connected via capacitor contacts 152 and 153 which pass through an interlayer insulating film 162 to storage capacitors 170, respectively.

As described above, the pillars 141 to 143 each have a trapezoidal shape, and thus, the distance D between the bottom of the capacitor contact 152 or 153 and the upper portion of the pillar 141 is wider than that in the conventional case.

Thereby, processing margins of the capacitor contacts 152 and 153 are enlarged. Thus, a shorting defect caused between the capacitor contact 152 or 153 and the pillar 141 can be prevented.

The storage capacitors 170 are buried in a thick interlayer insulating film 163. Structures thereof are not particularly limited, while in the present embodiment, the storage capacitors 170 are each configured by a lower electrode 171 connected to the capacitor contacts 152 or 153, an upper electrode 172 to which a plate potential is applied, and a capacitive insulating film 173 placed between the lower electrode 171 and the upper electrode 172. The upper electrode 172 is covered by an interlayer insulating film 164.

The structure of the semiconductor memory device according to the present embodiment is as described above.

In the semiconductor memory device according to the present embodiment, unlike conventional semiconductor memory devices, the pillars 142 and 143 exist between the cell contacts 132 and 133 and the capacitor contacts 152 and 153.

Accordingly, depths of the capacitor contacts 152 and 153 can be made shorter by an amount equal to heights of the pillars 142 and 143. That is, when the pillars 142 and 143 are not provided, the thick capacitor contacts 152 and 153 which pass through the interlayer insulating films 162 and 161 need to be formed. However, in the present embodiment, the pillars 142 and 143 are buried inside the interlayer insulating film 161, and consequently, the depths of the capacitor contacts 152 and 153 can be made correspondingly shorter.

Thereby, it becomes possible to enlarge bottom diameters of the capacitor contacts 152 and 153 as compared to those in the conventional case and precisely form the capacitor contacts 152 and 153. Accordingly, it becomes possible to prevent occurrence of shorting defects while decreasing resistance values of the capacitor contacts 152 and 153. Further, the pillars 142 and 143 can be formed simultaneously of the pillar 141 which corresponds to the bit contact, and thus, the number of steps for this portion does not increase.

The pillars 141 to 143 are configured by a metal material, and thus, series resistances between the diffusion regions 121 and 122 and the storage capacitors 170 are reduced. Further, because the pillars 141 to 143 each have a trapezoidal shape such that the diameter of the upper surface portion is smaller than that of the bottom surface portion, the processing margins of the capacitor contacts 152 and 153 are enlarged. Thereby, it becomes also possible to prevent a shorting defect between the capacitor contact 152 or 153 and the pillar 141.

A method of manufacturing the semiconductor memory device according to the present embodiment is described next in order of steps.

FIGS. 2A and 2B to FIGS. 13A and 13B are process drawings for explaining the method of manufacturing the semiconductor memory device. FIGS. 2A to 13A represent a schematic plane view and FIGS. 2B to 13B represent a schematic cross-sectional view along a line P-P shown in FIGS. 2A to 13A, respectively. In the plane views, for the sake of clearer illustration, part of constituent components (an insulating film and the like) is shown in a transparent manner.

Figure 2A:
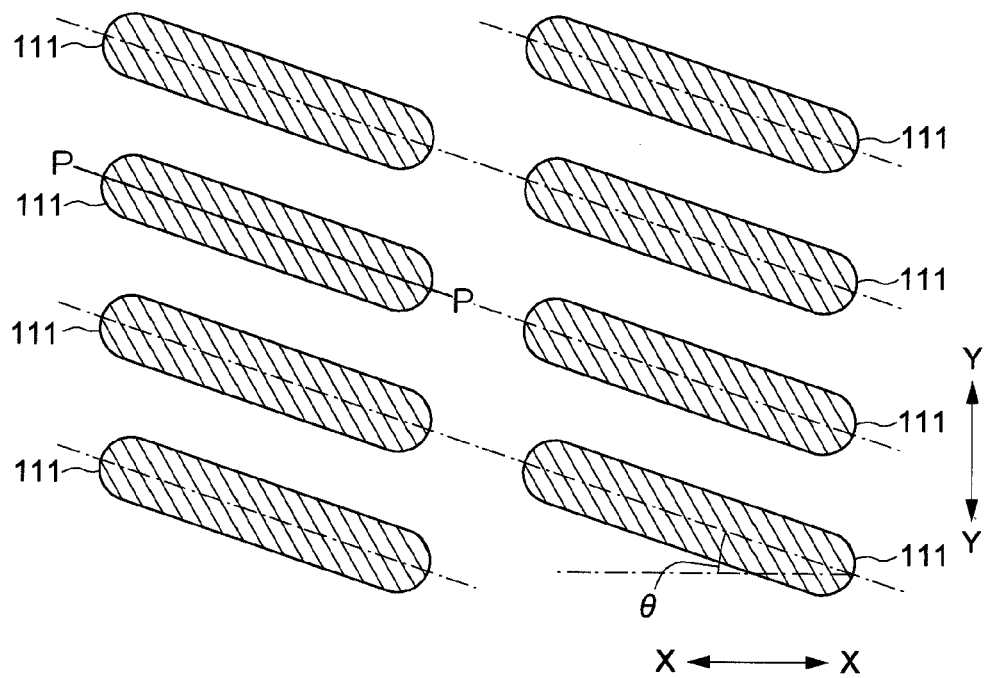
FIG. 2A is a schematic plan view showing a manufacturing process of the semiconductor memory device (forming element isolation regions) and FIG. 2B is a schematic cross sectional view along line P-P shown in FIG. 2A.
Figure 2B:
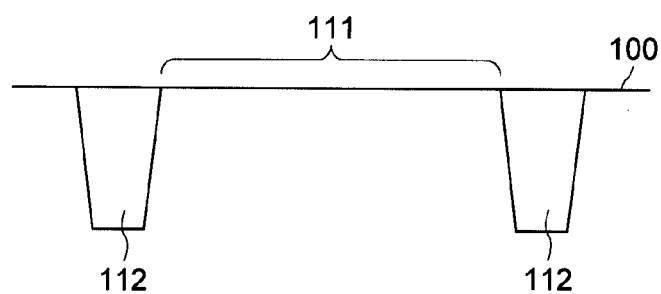

As shown in FIGS. 2A and 2B, the element isolation regions 112 are formed on a silicon substrate 100 by an STI (Shallow Trench Isolation) technique or the like to form plural active regions 111. The active regions 111 are in an approximately band shape having a predetermined length. A plurality of the active regions 111 are arranged in their lengthwise direction on a straight line. Although not particularly limited, the lengthwise direction of the active regions 111 has a predetermined angle $\theta$ relative to an X direction, where a direction orthogonal to an extending direction of the word line is the X direction. Although not particularly limited, the angle $\theta$ is preferably set to about 18 degrees.

Figure 3A:
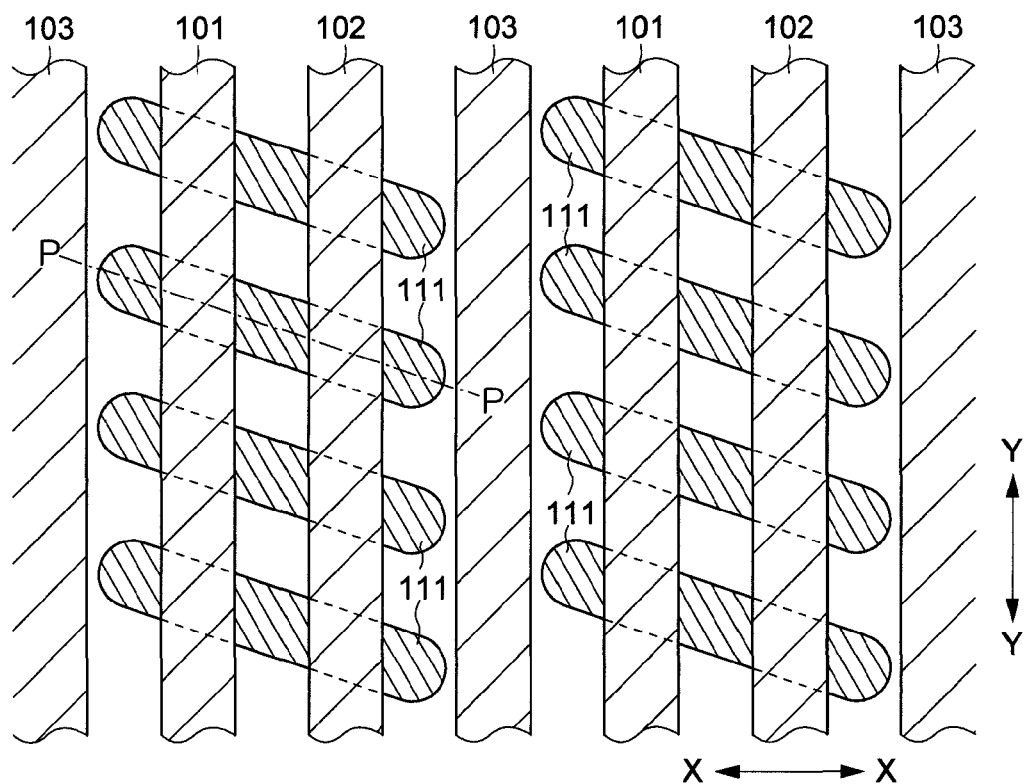
FIG. 3A is a schematic plan view showing a manufacturing process of the semiconductor memory device (forming word laminates) and FIG. 3B is a schematic cross sectional view along line P-P shown in FIG. 3A.
Figure 3B:
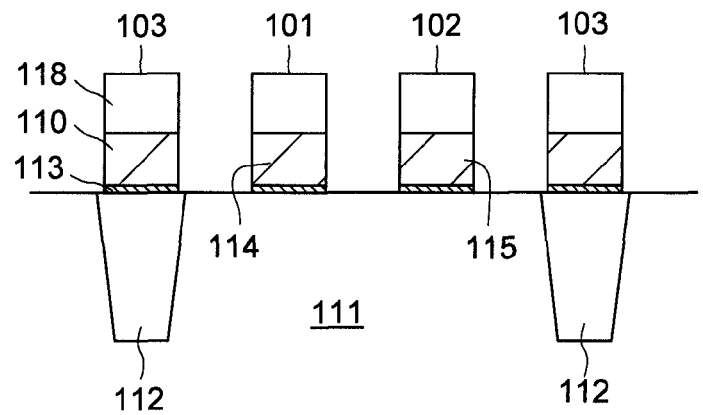

As shown in FIGS. 3A and 3B, a plurality of word laminates 101 to 103 are formed on the silicon substrate on which the active regions 111 are formed. The word laminates 101 to 103 are formed in a Y direction. Two word laminates 101 and 102 intersect with one active region 111. On the other hand, the word laminate 103 intersects with no active region 111.

In the formation of the word laminates 101 to 103, the gate insulating films 113 are firstly formed on surfaces of the active regions 111. On top thereof, a conductive film 110 is formed by depositing a polycrystalline silicon film, a tungsten silicide film (WSi), a tungsten nitride film (WN) and a tungsten film (W) in order. Further, on top of the conductive film 110, a gate cap insulating film 118 made of a silicon nitride film is formed.

Although not particularly limited, the polycrystalline silicon film which configures the conductive film 110 can be formed by an LP-CVD (Low-Pressure Chemical Vapor Deposition) method, and a film thickness thereof can be set to about 70 to 80 nm. The tungsten silicide film (WSi), the tungsten nitride film (WN), and the tungsten film (W) which configure the conductive film 110 can be formed by a PVD (Physical Vapor Deposition) method or a CVD method. Film thicknesses thereof can be set to about 7 nm, 10 nm, and 40 nm, respectively. The gate cap insulating film 118 can be formed by the LP-CVD method.

Subsequently, a multilayer film including the gate insulating film 113, the conductive film 110, and the gate cap insulating film 118 is patterned linearly. Thereby, the word laminates 101 to 103 are formed. The conductive film included in the word laminate 101 is the gate electrode (word line) 114, and the conductive film included in the word laminate 102 is the gate electrode (word line) 115. On the other hand, the conductive film included in the word laminate 103 is a dummy word line which does not actually function as a word line.

Figure 4A:
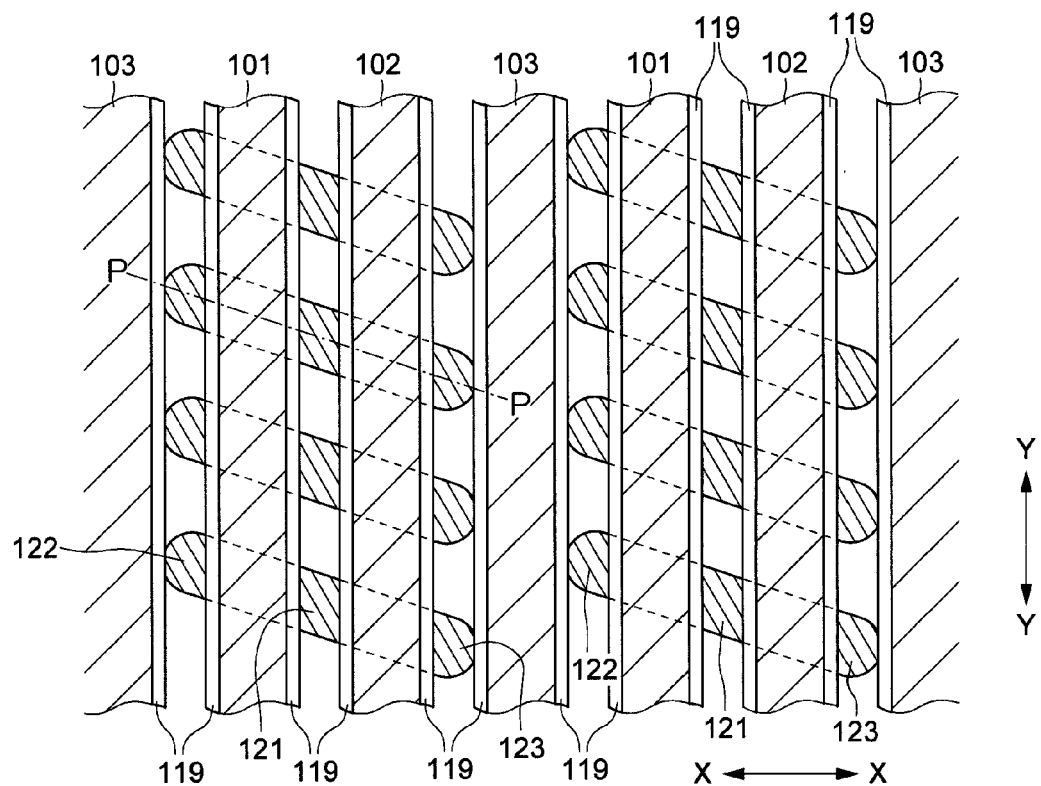
FIG. 4A is a schematic plan view showing a manufacturing process of the semiconductor memory device (forming sidewalls) and FIG. 4B is a schematic cross sectional view along line P-P shown in FIG. 4A.
Figure 4B:
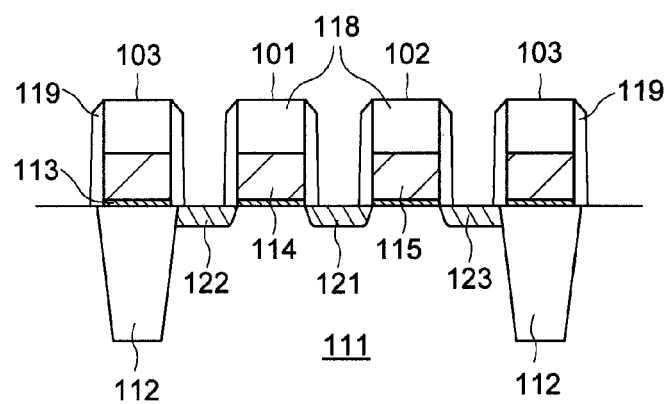

Subsequently, as shown in FIGS. 4A and 4B, sidewalls 119 are formed on both sides of the word laminates 101 to 103, respectively. The sidewalls 119 can be formed such that a silicon nitride film having a thickness of about 26 nm is formed on a whole surface of the substrate, and thereafter, the resultant surface is etched back. This is followed by ion implantation to form the diffusion regions 121 to 123. The ion implantation is preferably performed also before the formation of the sidewall 119 to form an LDD (Lightly-Doped Drain) region.

Figure 5A:
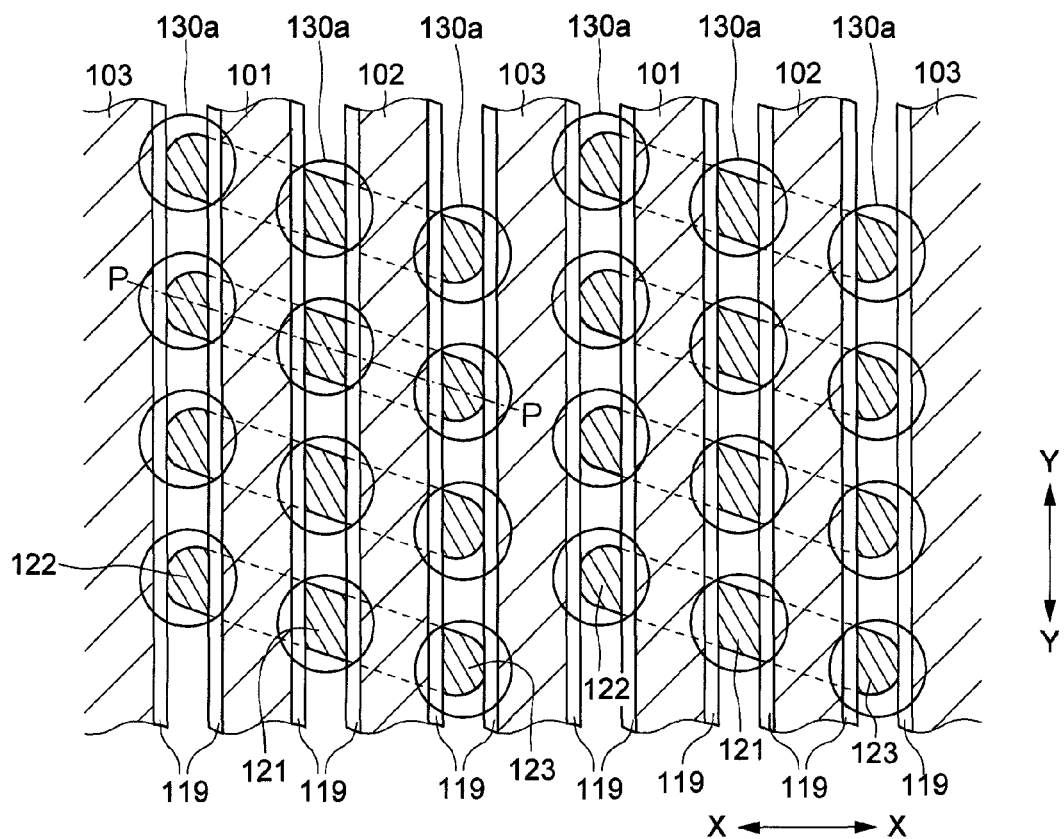
FIG. 5A is a schematic plan view showing a manufacturing process of the semiconductor memory device (forming apertures) and FIG. 5B is a schematic cross sectional view along line P-P shown in FIG. 5A.
Figure 5B:
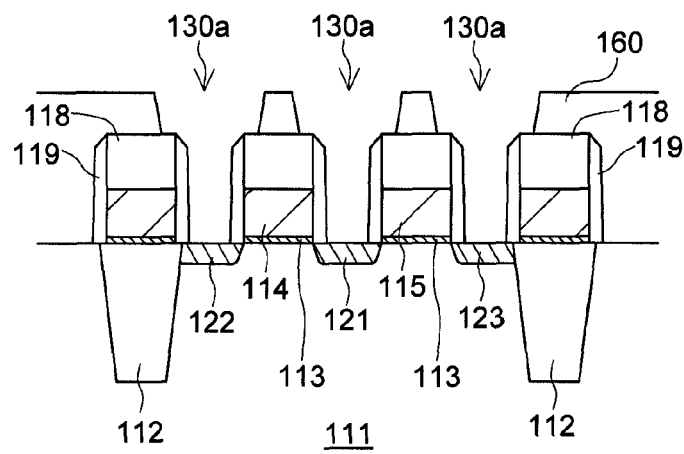

Thereafter, as shown in FIGS. 5A and 5B, an interlayer insulating film 160 made of BPSG (Boro-Phospho Silicate Glass) having a predetermined thickness is formed on a whole surface, and subsequently, dry etching is performed to form apertures 130a for exposing the diffusion regions 121 to 123. Because of the existence of the gate cap insulating films 118 and the sidewalls 119, the apertures 130a can be formed in a self-alignment manner relative to the gate electrodes 114 and 115. Thus, diameters of the apertures 130a are larger in upper portions where there are no gate cap insulating films 118 and the sidewalls 119 and smaller in lower portions where there are the gate cap insulating films 118 and the sidewalls 119.

Subsequently, the doped polycrystalline silicon (DOPOS) is formed on a whole surface, and thereby, interiors of the apertures 130a are filled by the doped polycrystalline silicon. This is followed by etching-back of the doped polycrystalline silicon.

Figure 6A:
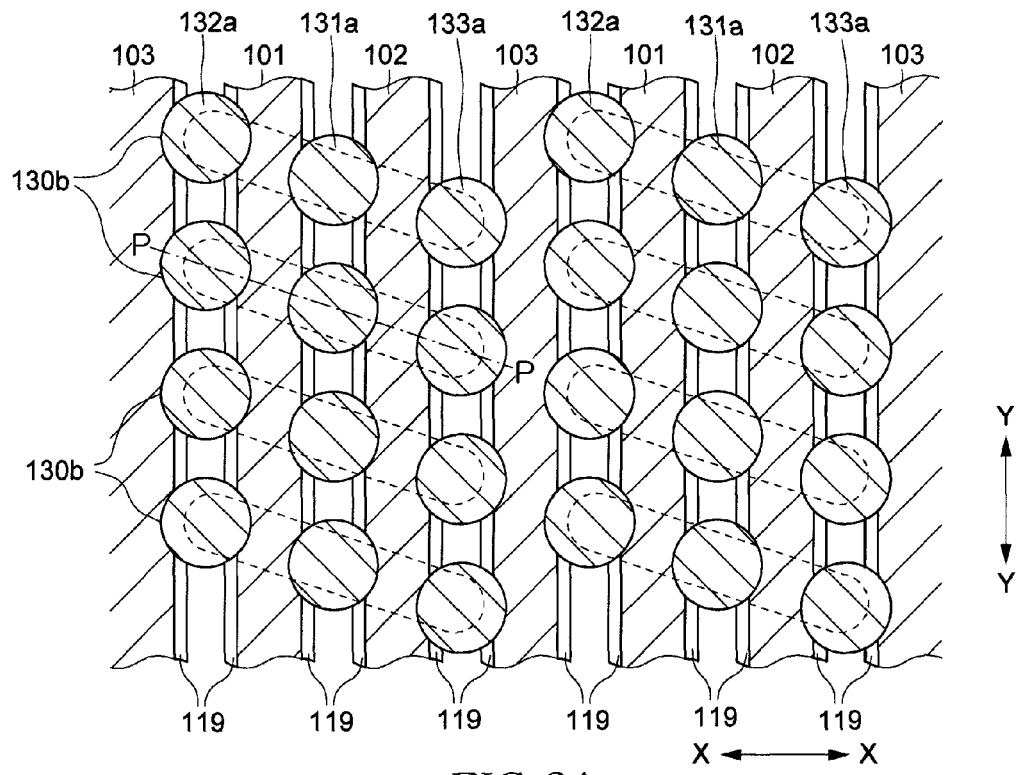
FIG. 6A is a schematic plan view showing a manufacturing process of the semiconductor memory device (forming lower regions of the cell contacts) and FIG. 6B is a schematic cross sectional view along line P-P shown in FIG. 6A.
Figure 6B:
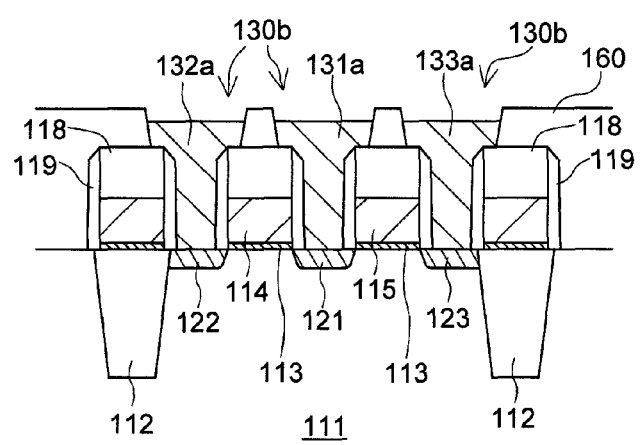

Consequently, as shown in FIGS. 6A and 6B, the interiors of the apertures 130a are formed with the lower regions 131a to 133a of the cell contacts. In the etching back of the doped polycrystalline silicon, over etching is performed to form concave portions 130b in upper portions of the apertures 130a. An amount of the over-etching is preferably adjusted such that top surfaces of the lower regions 131a to 133a are above those of the gate cap insulating films 118. The reason for this is that the diameters of the apertures 130a are large above the gate cap insulating films 118. As a result, surface areas of the lower regions 131a to 133a exposed in the concave portions 130b are sufficiently retained.

Subsequently, titan (Ti), titan nitride (TiN), and tungsten (W) are formed on a whole surface in this order, and thereby, interiors of at least the concave portions 130b are filled by these metal materials. Thereafter, a CMP (Chemical Mechanical Polishing) method is employed for polishing and removing.

Figure 7A:
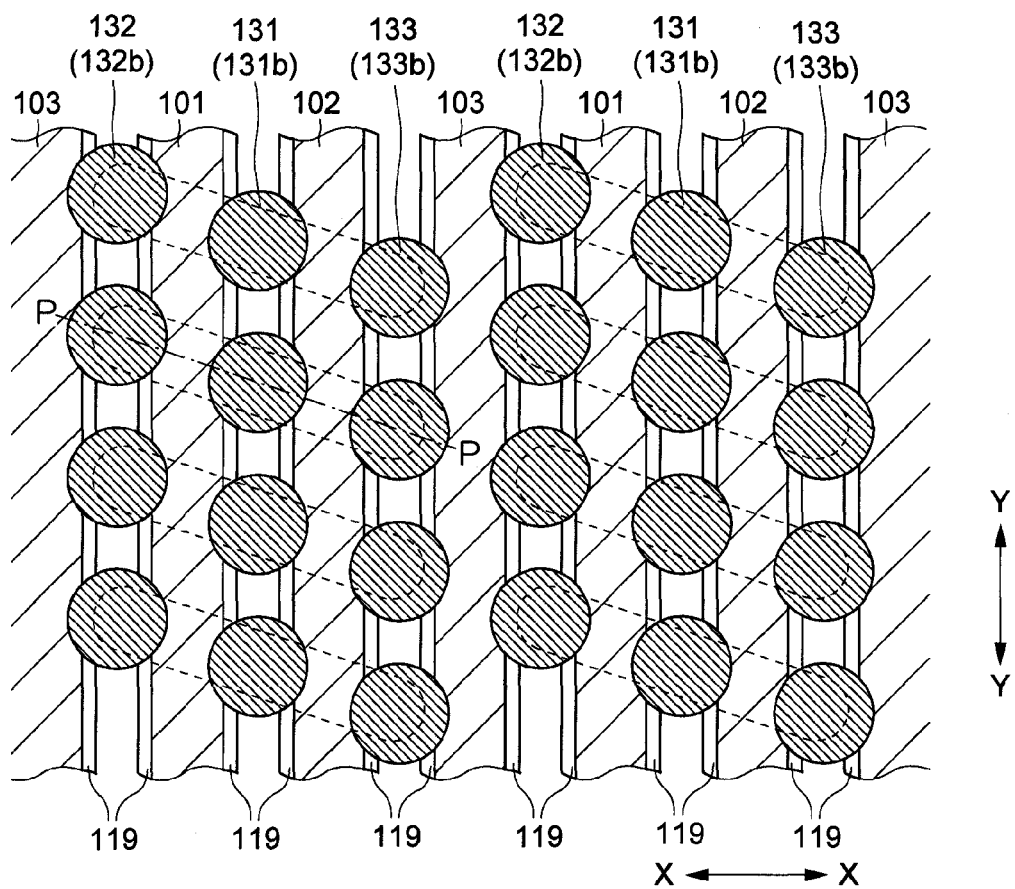
FIG. 7A is a schematic plan view showing a manufacturing process of the semiconductor memory device (forming upper regions of the cell contacts) and FIG. 7B is a schematic cross sectional view along line P-P shown in FIG. 7A.
Figure 7B:
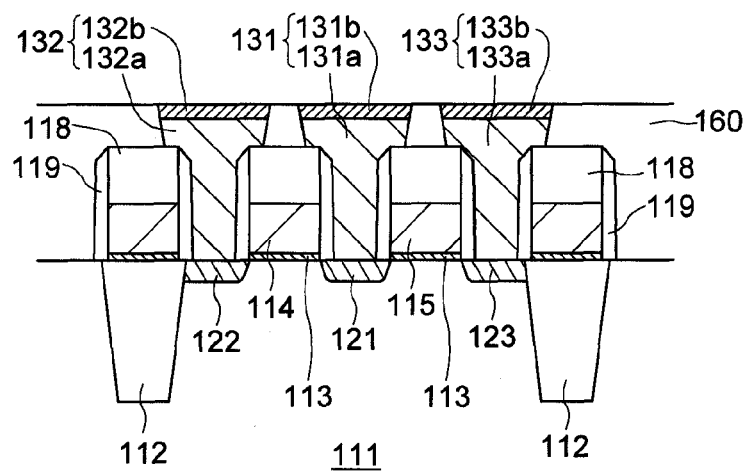

Thereby, as shown in FIGS. 7A and 7B, the interiors of the concave portions 130b are formed with the upper regions 131b to 133b of the cell contacts. As described above, the top surfaces of the lower regions 131a to 133a are located above those of the gate cap insulating films 118, and the surface areas are sufficiently retained. Thus, the interfaces between the lower regions 131a to 133a and the upper regions 131b to 133b are sufficiently wide areas. As a result, a resistance at the interface between the silicon and the metal is reduced.

Figure 8A:
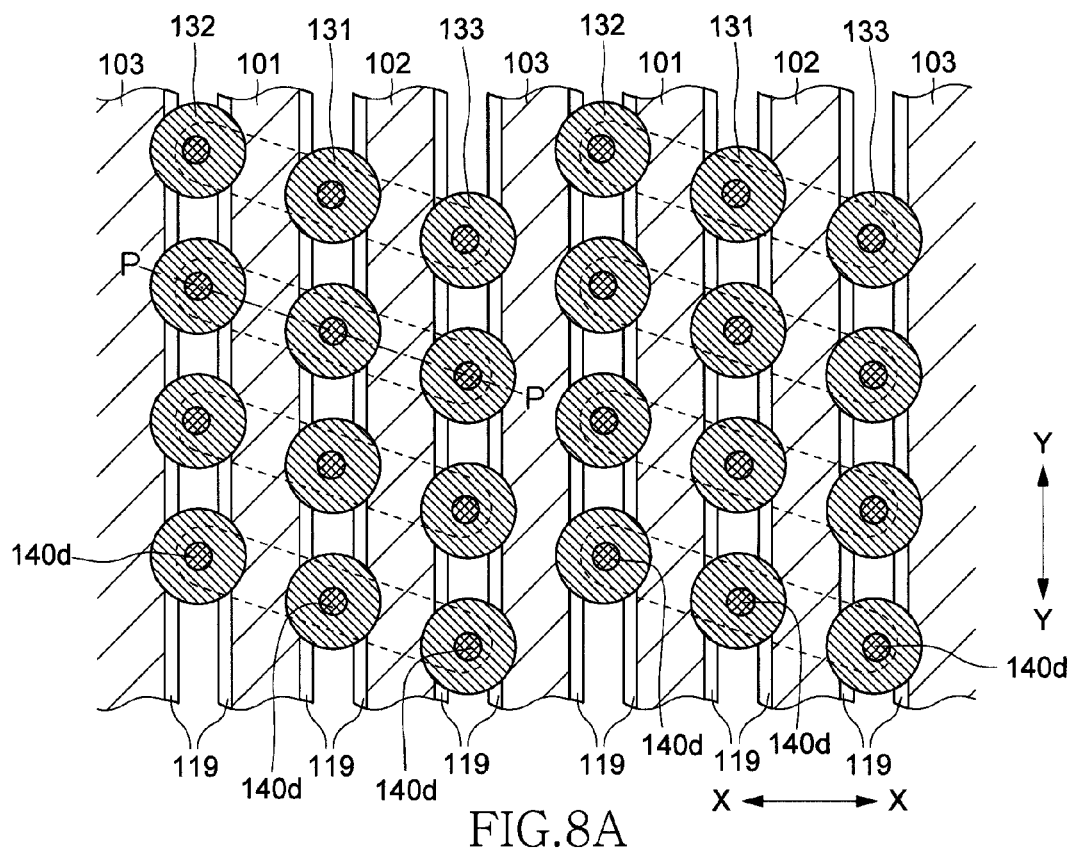
FIG. 8A is a schematic plan view showing a manufacturing process of the semiconductor memory device (forming a metal film, a silicon oxide film, an antireflection film, and photoresists)
Figure 8B:
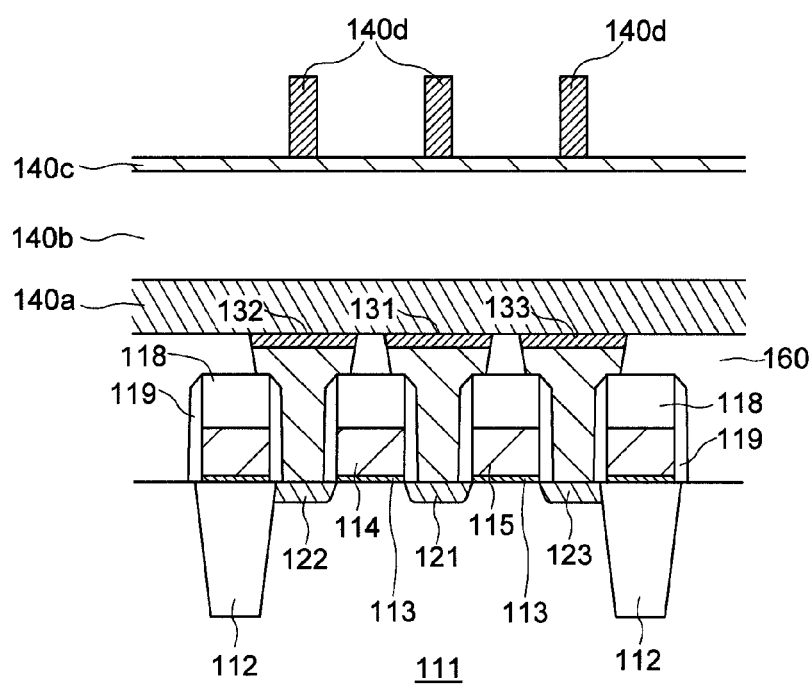
FIG. 8B is a schematic cross sectional view along line P-P shown in FIG. 8A.

Subsequently, as shown in FIGS. 8A and 8B, a metal film 140a made of tungsten (W) or the like, a silicon oxide film 140b, and an antireflection film 140c are formed in this order on a whole surface, and thereafter, photoresists 140d are formed in regions where the pillars 141 to 143 need to be formed. As a method of forming the metal film 140a, a sputtering method can be employed, thereby forming titan nitride (TiN) in thickness of 15 nm and tungsten (W) in thickness of 100 nm in this order. As a method of forming the silicon oxide film 140b, the CVD method in which TEOS (Tetra Methoxy Silane) is used as a material gas can be employed. A film thickness thereof can be set to about 200 nm. The antireflection film 140c is made of an organic coating film which is called BARC (bottom antireflective coating), and a film thickness thereof can be set to about 60 to 90 nm. A thickness of the photoresist 140d can be set to about 200 nm.

Figure 9A:
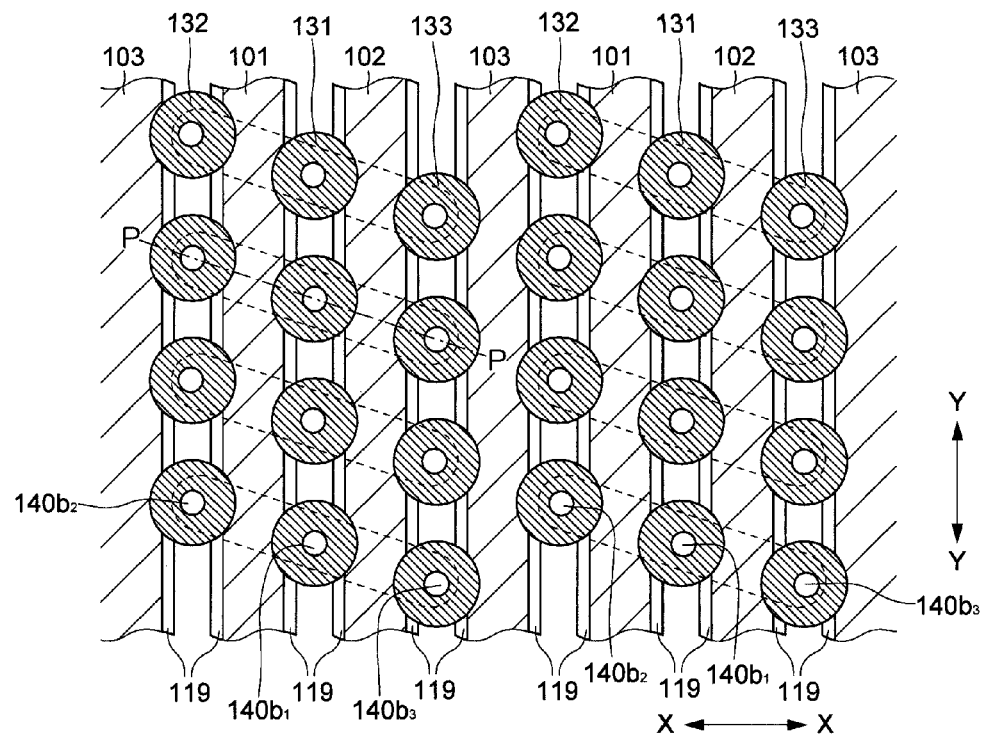
FIG. 9A is a schematic plan view showing a manufacturing process of the semiconductor memory device (forming hard masks) and FIG. 9B is a schematic cross sectional view along line P-P shown in FIG. 9A.
Figure 9B:
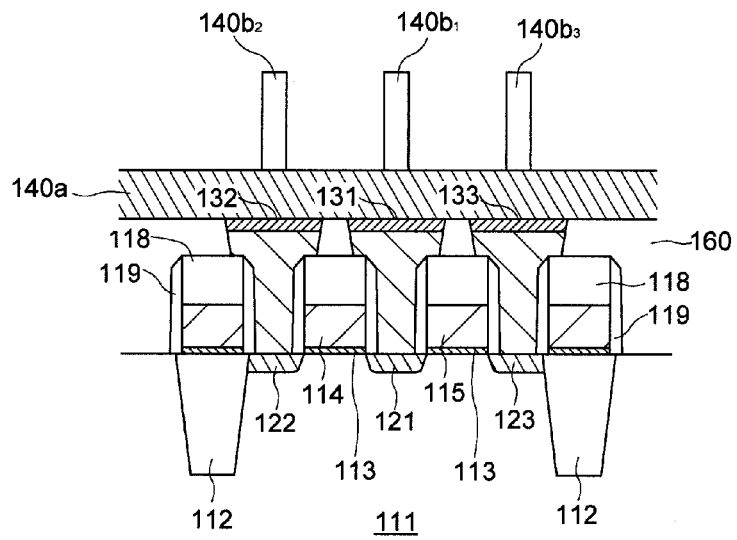

Subsequently, as shown in FIGS. 9A and 9B, the photoresists 140d are used as masks to pattern the antireflection film 140c and the silicon oxide film 140b to form hard masks $140b_1$ to $140b_3$. To form the hard masks, an effective magnetic field RIE (Reactive Ion Etching) etcher in which an electrode temperature is set to about 60° C. can be employed. Conditions in etching the antireflection film 140c can be: a pressure is set to 100 mTorr; an RF power is set to 400 W; $CF_4$ is used as an etching gas; and a flow rate thereof is set to 240 sccm. Conditions in etching the silicon oxide film 140b can be: a pressure is set to 180 mTorr; an RF power is set to 1000 W; $CF_4$, $CHF_3$, and Ar are used as etching gases; and flow rates thereof are set to 35 sccm, 100 sccm, and 200 sccm, respectively.

Figure 10A:
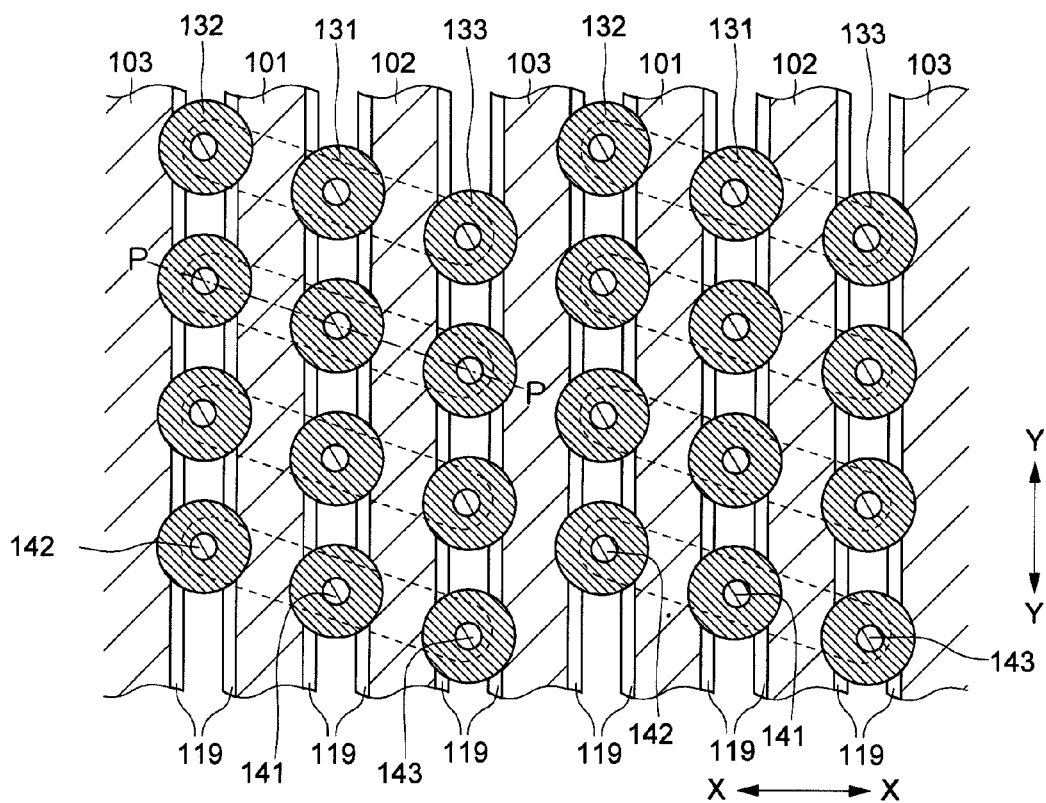
FIG. 10A is a schematic plan view showing a manufacturing process of the semiconductor memory device (forming pillars) and FIG. 10B is a schematic cross sectional view along line P-P shown in FIG. 10A.
Figure 10B:
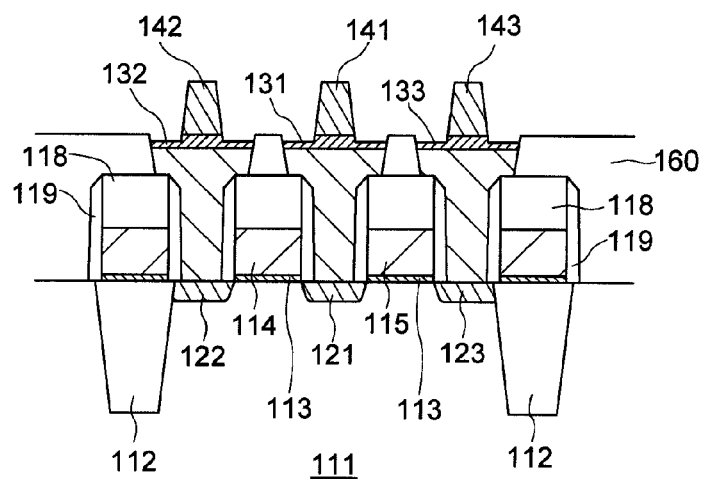

Thereafter, as shown in FIGS. 10A and 10B, the hard masks $140b_1$ to $140b_3$ are used as masks to pattern the metal film 140a. Consequently, the pillars 141 to 143 are formed. When the metal film 140a is made of tungsten (W), etching conditions of the metal film 140a can be: an ICP (Inductively coupled plasma) etcher in which an electrode temperature is set to about 20° C. is employed; a pressure is set to 10 mTorr; a source power is set to 800W; a bias power is set to 90W; $SF_6$, $Cl_2$, $N_2$, and Ar are used as etching gases; and flow rates thereof are set to 30 sccm, 70 sccm, 25 sccm, and 100 sccm, respectively.

When the metal film 140a is etched under these conditions, the pillars 141 to 143 are formed in a trapezoidal shape such that the diameters of the upper surface portions are smaller than those of the bottom surface portions. Although not particularly limited, the diameters of the upper surface portions of the pillars 141 to 143 can be set to about 70 nm, and those of the bottom surface portions can be set to about 90 to 100 nm.

When the metal film 140a is etched, small amounts of the upper regions 131b to 133b of the cell contacts are also etched. Accordingly, when the etching amount is too large, all the upper regions 131b to 133b are etched in portions not covered by the pillars 141 to 143. This reduces contact areas between the lower regions 131a to 133a and the upper regions 131b to 133b. Thus, when the metal film 140a is etched, it is preferable that the etching amount be adjusted such that all the upper regions 131b to 133b in the portions not covered by the pillars 141 to 143 are not etched.

Figure 11A:
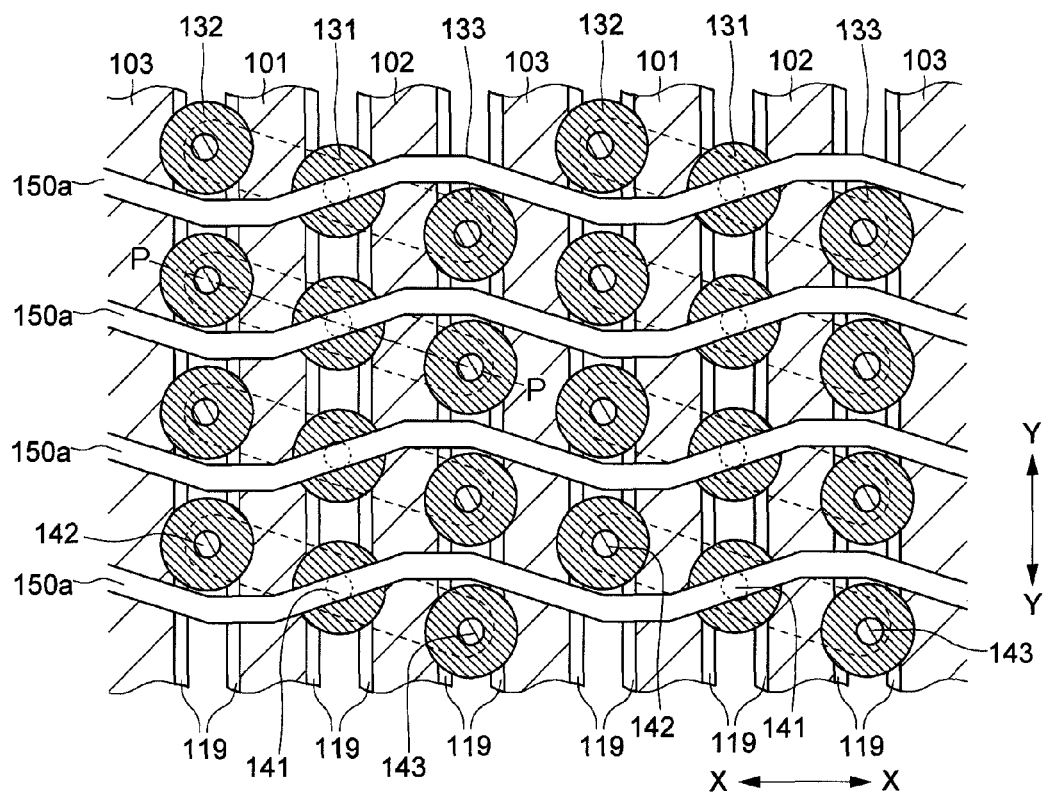
FIG. 11A is a schematic plan view showing a manufacturing process of the semiconductor memory device (forming damascene grooves) and FIG. 11B is a schematic cross sectional view along line P-P shown in FIG. 1A.
Figure 11B:
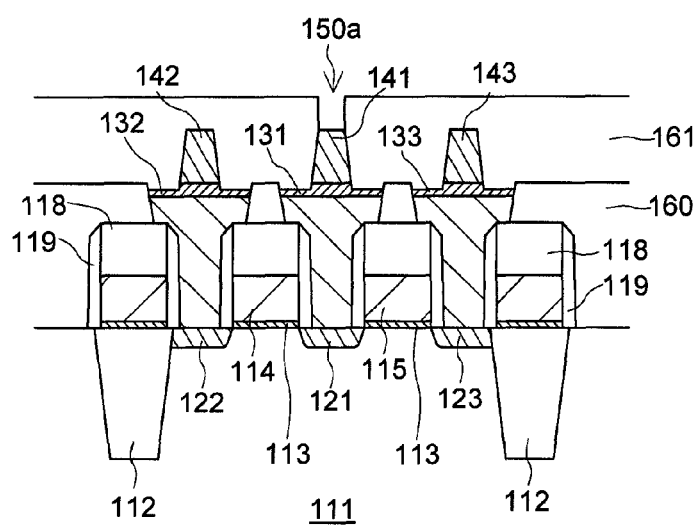

Subsequently, as shown in FIGS. 11A and 11B, the interlayer insulating film 161 is formed on a whole surface to bury the pillars 141 to 143. Thereafter, damascene grooves 150a are formed. As shown in FIG. 11A, each of the damascene grooves 15a exposes a top of the pillar 141, and are formed in the X direction in a serpentine manner to avoid the pillars 142 and 143.

Figure 12A:
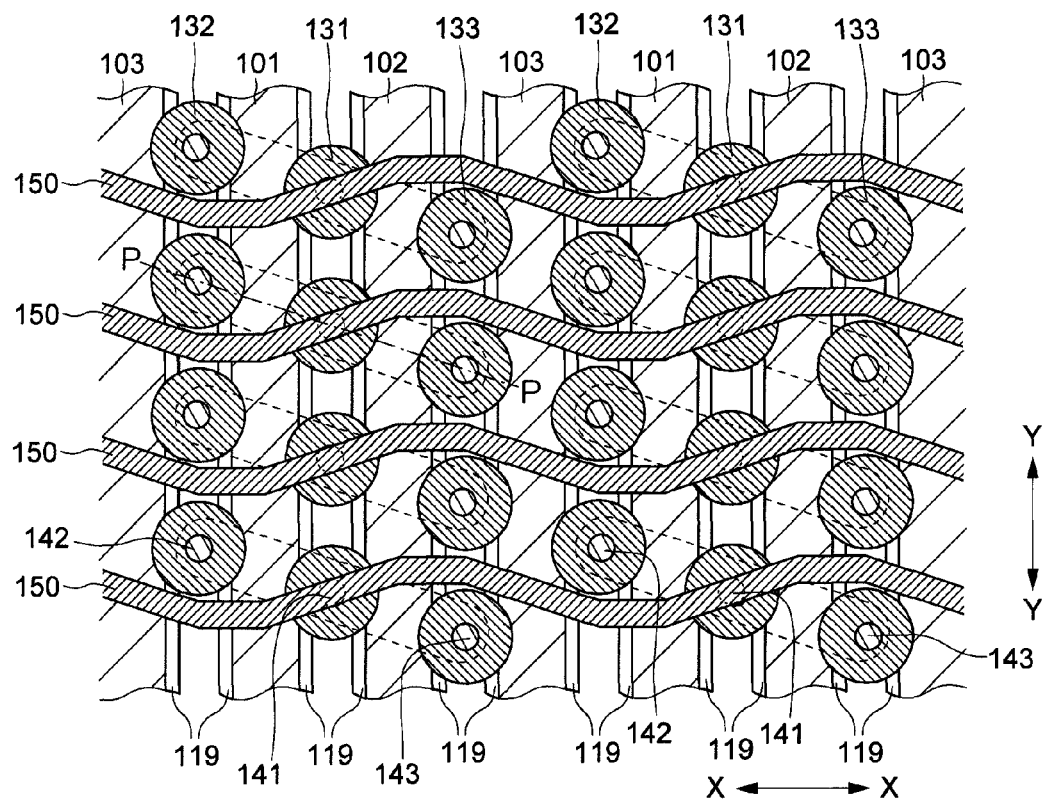
FIG. 12A is a schematic plan view showing a manufacturing process of the semiconductor memory device (forming a bit line) and FIG. 12B is a schematic cross sectional view along line P-P shown in FIG. 12A.
Figure 12B:
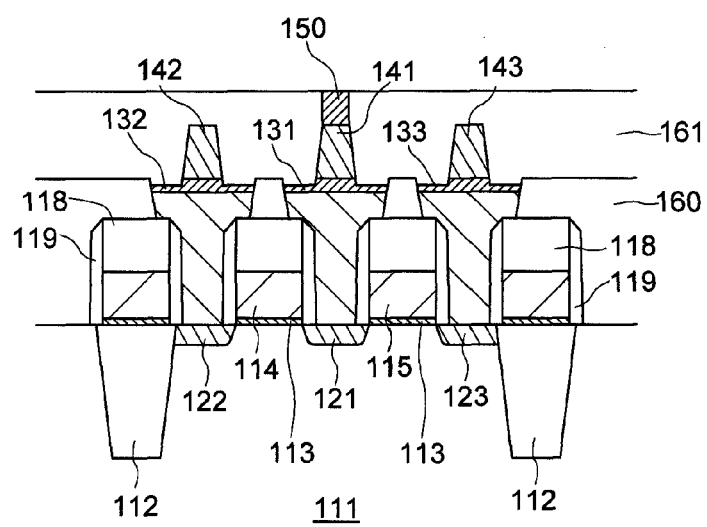

Thereafter, as shown in FIGS. 12A and 12B, a metal material which forms a material of the bit line is formed on a whole surface, and subsequently, the whole surface is polished by the CMP method. As a result, a bit line 150 in thickness of about 100 nm is formed in an interior of the groove 150a. When a damascene method is employed to form the bit line 150, a minute pattern can be formed precisely. It also becomes possible to use a metal material such as copper (Cu), which is difficult to pattern, as a material of the bit line 150. Although not particularly limited, when the damascene method is employed, a wiring width of the bit line 150 can be set to about 35 nm, and an inter-wiring distance (space) can be set to about 105 nm.

Figure 13A:
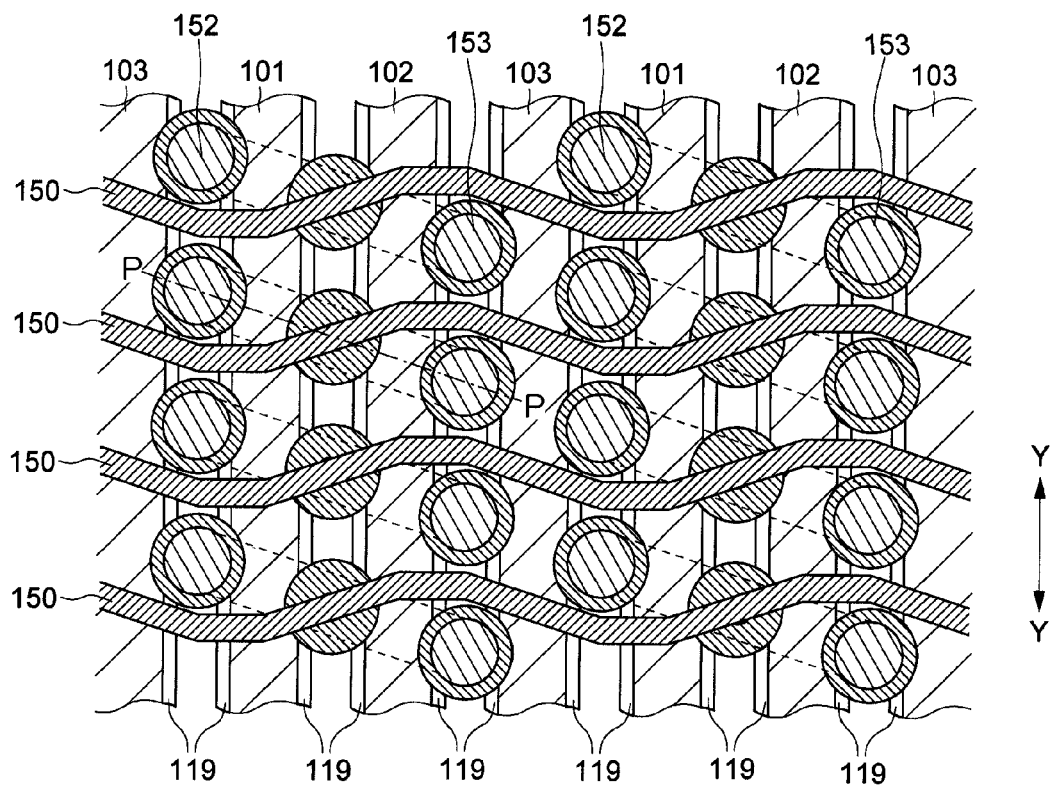
FIG. 13A is a schematic plan view showing a manufacturing process of the semiconductor memory device (forming capacitor contacts) and FIG. 13B is a schematic cross sectional view along line P-P shown in FIG. 13A.
Figure 13B:
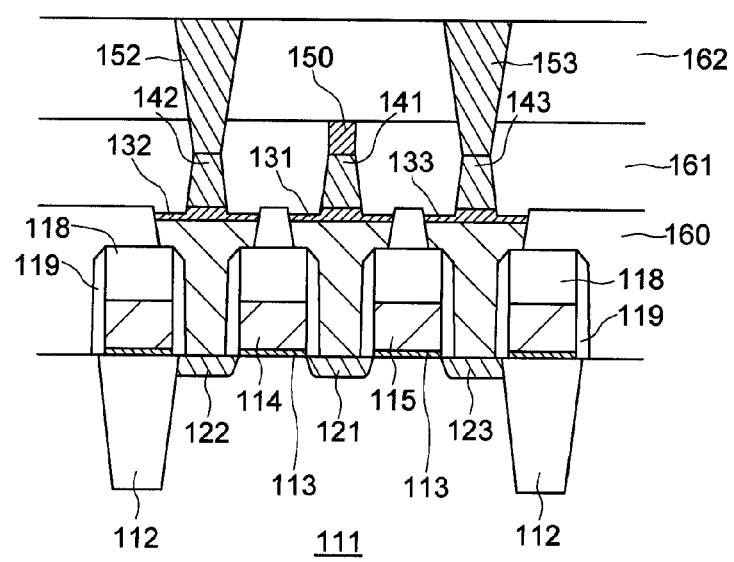

Subsequently, as shown in FIGS. 13A and 13B, a thick interlayer insulating film 162 made of a silicon oxide film is formed, and thereafter, contact holes for exposing the pillars 142 and 143 are formed. Subsequently, a metal material, such as tungsten (W), is deposited on a whole substrate surface including interiors of the contact holes, and thereafter, the metal material is polished by the CMP. Thereby, the capacitor contacts 152 and 153 are formed.

In the formation of the capacitor contacts 152 and 153, the contact holes need to be formed correctly in a bit line gap (of about 105 nm, for example) such that no short circuit occurs between the capacitor contacts 152 and 153 and the bit line 150. Thus, when the contact holes become deeper, it becomes more difficult to retain the bottom diameter. However, in the present embodiment, due to the existence of the pillars 142 and 143, the depths of the contact holes can be made shorter. Thereby, the bottom diameters of the contact holes can be enlarged, and thus, resistances of the capacitor contacts 152 and 153 can be reduced.

Specifically, when a film thickness of the interlayer insulating film 162 is 500 nm, top diameters of the capacitor contacts 152 and 153 are set to about 80 nm. Thereby, it becomes possible to retain about 40 nm of the bottom diameters of the capacitor contacts 152 and 153.

Subsequent thereto, according to a well-known method, the storage capacitors 170 are formed above the capacitor contacts 152 and 153. Consequently, the semiconductor memory device shown in FIG. 1 is completed.

Thus, according to the present embodiment, the metal film 140a is patterned to form the pillars 141 to 143. Thereby, the pillars 142 and 143 can be formed at the same time as the pillar 141 which corresponds to the bit contact is formed. That is, the pillars 142 and 143 can be formed without any additional step. Further, in the present embodiment, the pillars 142 and 143 and the capacitor contacts 152 and 153 are configured of a metal material, and thus, a series resistance between the diffusion regions 121 and 122 and the storage capacitor 170 can be also reduced.

The present invention is in no way limited to the aforementioned embodiments, but rather various modifications are possible within the scope of the invention as recited in the claims, and naturally these modifications are included within the scope of the invention.

For example, in the present embodiment, the pillars 141 to 143 are configured of the metal material. However, this point is not essential for the present invention. Even so, when the pillars 141 to 143 are configured of the metal material, the series resistance between the diffusion regions 121 and 122 and the storage capacitor 170 can be reduced, as described above.

In the present embodiment, the pillars 141 to 143 are formed in a trapezoidal shape such that the diameters of the upper surface portions are smaller than those of the bottom surface portions. However, this point is not essential for the present invention. Even so, when the pillars 141 to 143 are thus shaped, the distance D between the capacitor contact 152 or 153 and the pillar 141 can be enlarged, as described above.

In the present embodiment, the upper regions 131b to 133b of the cell contacts 131 to 133 are configured of the metal material. However, this point is not essential for the present invention. Even so, when the upper regions 131b to 133b of the cell contacts 131 to 133 are configured of the metal material, an area of the interface between the polycrystalline silicon and the metal material can be sufficiently retained, as described above. As a result, the series resistance between the diffusion regions 121 and 122, and the storage capacitor 170 can be reduced. However, when no metal material is formed in the upper regions of the cell contacts 131 to 133, all the cell contacts 131 to 133 are configured of the doped polycrystalline silicon. Thus, the pillars 141 to 143 formed on top thereof need to be laminated films made of titan (Ti), titan nitride (TiN), and tungsten (W).

In the present embodiment, the bit line 150 is formed by the damascene method. However, a method of forming the bit line 150 is not limited thereto. Thus, a normal patterning method can be used to form the bit line 150. Even so, when the bit line 150 is formed by the damascene method, the minute pattern can be formed precisely, as described above.

In the present embodiment, the storage capacitor 170 has a cylindrical shape. The shape of the storage capacitor is not limited thereto, and the storage capacitor can be formed in other shapes such as a columnar shape and a crown shape.

What is claimed is:

1. A method of manufacturing a semiconductor memory device, comprising:
    forming a transistor including first and second diffusion regions;
    forming first and second cell contacts connected to the first and second diffusion regions, respectively;
    forming first and second pillars connected to the first and second cell contacts, respectively;
    forming a bit line connected to the first pillar;
    forming a capacitor contact connected to the second pillar; and
    forming a storage capacitor connected to the capacitor contact,
    wherein a diameter of at least one of an upper surface portion of the first pillar and an upper surface portion of the second pillar is smaller than a diameter of a bottom surface portion of the first pillar and a bottom surface portion of the first portion of the second pillar, respectively, wherein the upper surface portion of the first pillar is a surface portion that contacts the bit line, the upper surface portion of the second pillar is a surface portion that contacts the capacitor contact, the bottom surface portion of the first pillar is a surface portion that is opposite to the upper surface portion of the bit contact, and the bottom surface portion of the second pillar is a surface portion that is opposite to the upper surface portion of the second pillar.

2. The method of manufacturing a semiconductor memory device as claimed in claim 1, wherein the forming the first and second pillars comprises patterning a metal material to form the first and second pillars.

3. The method of manufacturing a semiconductor memory device as claimed in claim 1, wherein the bit line is formed by a damascene method.

4. The method of manufacturing a semiconductor memory device, the method comprising: a first step for forming a transistor including first and second diffusion regions;
    a second step for simultaneously forming first and second cell contacts connected to the first and second diffusion regions, respectively;
    a third step for simultaneously forming first and second pillars connected to the first and second cell contacts, respectively;
    a fourth step for forming a bit line connected to the first pillar;
    a fifth step for forming a capacitor contact connected to the second pillar; and
    a sixth step for forming a storage capacitor connected to the capacitor contact,
    the method further comprising: after the second step and before the third step,
    a step for forming concave portions by over-etching the first and second cell contacts; and
    a step for burying a metal material into the concave portions,
    wherein at the third step a metal material is patterned to form the first and second pillars.

5. A method of manufacturing a semiconductor device, the method comprising:
    forming first and second contacts over a substrate, the first contact being apart from the second contact and each of the first and second contacts having a top surface;
    forming a first conductive line in contact with at least a part of the top surface of the first contact, the first conductive line having a top surface; and
    forming a third contact in contact with at least a part of the top surface of the second contact, the third contact having a top surface that is different in level from the top surface of the first conductive line,
    wherein the diameter of at least one of the top surface of the first contact and the top surface of the second contact is smaller than the diameter of a bottom surface of the first contact and a bottom surface of the second contact, respectively, wherein the bottom surface of the first contact is a surface that is opposite to the top surface of the first contact, and the bottom surface of the second contact is a surface that is opposite to the top surface of the second contact.

6. The method as claimed in claim 5, wherein the forming the first and second contacts comprises forming a conductive layer and selectively removing the conductive layer to form the first and second contacts.

7. The method as claimed in claim 6, further comprising forming a first insulating layer over the first and second contacts and filling a gap between the first and second contacts with the first insulating layer, and forming a first hole in the first insulating film to expose the part of the top surface of the first contact, the first conductive line being in contact with the part of the first contact through the first hole.

8. The method as claimed in claim 5, further comprising forming an insulating layer over the second contact and the first conductive line and forming a hole in the insulating layer to expose the part of the top surface of the second contact, the third contact being in contact with the part of the top surface of the second contact through the hole.

9. A method comprising:
forming first and second contacts over a substrate, the first contact being apart from the second contact and each of the first and second contacts having a top surface;
forming a first conductive line in contact with at least a part of the top surface of the first contact, the first conductive line having a top surface;
forming a third contact in contact with at least a part of the top surface of the second contact, the third contact having a top surface that is different in level from the top surface of the first conductive line;
forming a first insulating layer over the first and second contacts and filling a gap between the first and second contacts, and forming a first hole in the first insulating film to expose the part of the top surface of the first contact, the first conductive line being in contact with the part of the first contact through the first hole; and
forming a second insulating layer over the first conductive line and the first insulating layer and forming a second hole in the second insulating layer to expose the part of the top surface of the second contact, the third contact being in contact with the part of the top surface of the second contact through the second hole,
wherein the forming the first and second contacts comprises forming a conductive layer and selectively removing the conductive layer to form the first and second contacts.

10. A method of manufacturing a semiconductor device, the method comprising:

forming a bit contact;
forming a bit line in contact with the bit contact;
forming a capacitor contact; and
forming a capacitor in contact with the capacitor contact; wherein
the forming the capacitor contact comprising forming a first portion of the capacitor contact simultaneously with the bit contact and forming a second portion of the capacitor contact after forming the bit line, wherein a diameter of at least one of an upper surface portion of the bit contact and an upper surface portion of the first portion of the capacitor contact is smaller than a diameter of a bottom surface portion of the bit contact and a bottom surface portion of the first portion of the capacitor contact, respectively, wherein the upper surface portion of the bit contact is a surface portion that contacts the bit line, the upper surface portion of the first portion of the capacitor contact is a surface portion that contacts the second portion of the capacitor contact, the bottom surface portion of the bit contact is a surface portion that is opposite to the upper surface portion of the bit contact, and the bottom surface portion of the first portion of the capacitor contact is a surface portion that is opposite to the upper surface portion of the first portion of the capacitor contact.

11. The method as claimed in claim 10, wherein the forming the first portion of the capacitor contact simultaneously with the bit contact comprises forming a conductive layer, and patterning the conductive layer to form the bit contact and the first portion of the capacitor contact.

12. The method as claimed in claim 11, further comprising forming a first insulating layer over the bit contact and the first portion of the capacitor contact, and forming a first hole of the first insulating layer to expose a part of the bit contact, the bit line being in contact with the exposed part of the bit contact though the first hole.

13. The method as claimed in claim 12, further comprising forming a second insulating layer over the first insulating layer and the bit line, and forming a second hole in the second insulating layer to expose a part of the first portion of the capacitor contact, the second portion of the capacitor contact being in contact with the first portion of the capacitor contact exposed through the second hole.

* * * * *